US007230217B2

(12) United States Patent
Risman

(10) Patent No.: US 7,230,217 B2
(45) Date of Patent: Jun. 12, 2007

(54) HYBRID RECTANGULAR HEATING APPLICATORS

(75) Inventor: Per O. Risman, Härryda (SE)

(73) Assignee: EXH LLC, Eagan, MN (US)

( * ) Notice: Subject to any disclaimer, the term of this patent is extended or adjusted under 35 U.S.C. 154(b) by 0 days.

(21) Appl. No.: 10/516,686

(22) PCT Filed: Jun. 10, 2003

(86) PCT No.: PCT/SE03/00957

§ 371 (c)(1),
(2), (4) Date: Aug. 30, 2005

(87) PCT Pub. No.: WO03/105534

PCT Pub. Date: Dec. 18, 2003

(65) Prior Publication Data

US 2006/0124635 A1 Jun. 15, 2006

(30) Foreign Application Priority Data

Jun. 7, 2002 (SE) .................................... 0201755

(51) Int. Cl.
*H05B 6/70* (2006.01)
*H01L 1/28* (2006.01)

(52) U.S. Cl. ....................................... 219/690; 333/248

(58) Field of Classification Search ................ 219/690, 219/678, 691, 694, 695; 333/248, 251
See application file for complete search history.

(56) References Cited

U.S. PATENT DOCUMENTS

| | | | | |
|---|---|---|---|---|
| 3,605,101 | A * | 9/1971 | Kolettis et al. | 343/783 |
| 5,828,040 | A | 10/1998 | Risman | |
| 5,935,190 | A * | 8/1999 | Davis et al. | 701/119 |
| 5,969,817 | A * | 10/1999 | Ohsawa | 356/510 |
| 6,239,418 | B1 * | 5/2001 | Konig et al. | 219/756 |
| 6,518,857 | B1 * | 2/2003 | Hattori et al. | 333/134 |
| 6,605,454 | B2 * | 8/2003 | Barenburg et al. | 435/173.7 |

FOREIGN PATENT DOCUMENTS

| | | |
|---|---|---|
| WO | WO 99/48335 | 9/1999 |

* cited by examiner

*Primary Examiner*—Daniel Robinson
(74) *Attorney, Agent, or Firm*—Harness, Dickey & Pierce, P.L.C.

(57) ABSTRACT

A rectangular microwave applicator operating at a predetermined frequency and comprising a microwave enclosure forming a cavity having first and second transverse dimensions and a longitudinal dimension n the direction of propagation of microwave energy, wherein said dimensions are such that a main power-transferring $Teym_1n$ mode with a long vertical wavelength is enhanced, and a significant amplitude of a complementary $Teym_2n$ mode is created, wherein $m_1$, $m_2$ and n are positive odd integers and $m_2$ and n are both less or equal to $m_{1-2}$.

9 Claims, 2 Drawing Sheets

HYBRID RECTANGULAR HEATING APPLICATORS

FIELD OF THE INVENTION

The present invention is directed to the field of open-ended microwave applicators for heating a load exterior to and not necessarily contacting the open end of the applicator. The load is typically transported on a microwave transparent conveyor and there is a metal structure below the conveyor acting both as a part of the overall microwave enclosure and for improving the heating evenness of the load.

BACKGROUND OF THE INVENTION

Prior art applicators of the kind within the field of this invention are described in U.S. Pat. No. 5,828,040 and EP-A2-0,746,182 (commonly referred to as PAT in the following). The particular single hybrid mode applicators of this prior art solve a major problem with still earlier prior art: that of uneven heating as evidenced by a patchy and quite unpredictable heating pattern with hot and cold spots (caused by multimode action) and that of excessive edge overheating of loads with high permittivity such as typical compact food items (caused by strong electric horizontal field components which are then parallel to the major edges of the food item).

The particular type of hybrid mode in the applicator described in PAT is characterised by very low vertically (z-) directed impedance, which results in low horizontal (x;y) electric field strengths in relation to those of perpendicularly (z-directed) impinging plane waves. By the choice of a TEy hybrid mode (the feed orientation determines if the mode becomes a TEy or TEx mode), the y-directed electric field component in the applicator becomes zero, which is still more advantageous since edge overheating of y-directed load edges will then not occur.

The particular low impedance applicator mode has preferably its low horizontal index 1 in the direction of transport, since microwave leakage in that direction from the applicators is then minimised. This results in minimum inter-applicator interaction (cross talk) along this direction, and reduces the complexity of the tunnel end microwave choking structures. With the load transport hence in the y direction, the heating pattern of each individual applicator in moving loads becomes striped. This is compensated for by sideways (in the x direction) staggering of following applicators or applicator rows.

The particular low impedance TEy mode has a tendency to create a trapped surface wave mode (a so-called longitudinal section magnetic, LSM, mode) in the region including the undersides of the load items and the metal bottom structure of the tunnel. Even if these modes result in a favourable heating from below in typical food items of about 15 mm or more in height, a problem when several staggered applicators are used is that a significant part of the heating pattern is determined by x-directed standing LSM waves between the sidewalls of the tunnel oven and not only by the fields of the individual applicators.

If the particular TEy mode is used, there may be a tendency of both spreading-out of the applicator fields in the x direction and of inter-applicator crosstalk (i.e. unwanted power transfer between adjacent applicators, either by direct coupling or by LSM mode coupling through the load region). None of the above-mentioned patent documents referred to as PAT do provide any remedy to these imperfections.

In those documents, the preferred embodiments are slot feeds in the top of the applicator sidewalls and the applicator has the TEy11 or TEy21 modes. However, there are cases when larger applicator openings are preferred, in order to achieve a lower power flux density to the load items without a need for reducing the output power of each microwave generator (magnetron). In order for applicators for higher modes, e.g. TEy31 or TEy51 to be successfully designed, other microwave feeding means become necessary.

If the tunnel height is large, there will be an increased likelihood of microwave leakage through the tunnel ends into ambient. For fixed tunnel heights one may then use various kinds of prior art chokes, such as delay lines, quarterwave chokes and chokes which act by mode mismatching. Absorbing media may also be used. Such chokes or absorbers are normally only applied to the horizontal surfaces (top and bottom) of the tunnel opening, but may also be used at the vertical sidewalls in the tunnel opening and choking region. However, if the tunnel height is to be variable, prior art choke structures in the vertical walls become very difficult to employ.

SUMMARY OF THE INVENTION

The present invention addresses the problems of x-directed LSM waves, applicator mode spread-out for high tunnel heights, and vertical tunnel wall choking, by means including a particular design of the open-ended applicator characterised by using two complementing TEy modes instead of only one as described in the above-referenced patents (PAT). The mode providing the main power transfer to the load is a low impedance TEym1 mode as described in PAT, but the preferred embodiment is now with odd m (=3 or 5), and the other mode which is simultaneously excited has the only purpose of providing a counter-directed magnetic field in the y direction at the vertical y-directed applicator wall opening. The effect of this mode interaction is that the major mode propagates in a much more undisturbed and confined way downwards to the load. This use of two complementary applicator modes is the first and a major embodiment of the present invention.

Additionally, under typical circumstances, the heating pattern in the y-direction becomes more elongated which is also advantageous. To achieve this while using the TEy31 mode for the main power transfer, the TEy11 mode is also excited, and the excitation is symmetrical around the applicator ceiling centre in both the x and y directions. This requires at least two parallel y-directed excitation slots. Such an excitation geometry will also eliminate the excitation of all TEymn modes with either or both indices m and n being even, which is an important feature since the applicator needs to be larger in the x direction so that it becomes possible for it to support such higher modes. This feed type is a second embodiment of the invention.

The excitation by simply making two parallel slots in the wide (a) side at opposite narrow (b) sides in a TE10 waveguide results in the right opposite polarity of the magnetic fields in the slots. However, in-order for the transition between the TE10 waveguide and the applicator to also perform a good impedance. transformation, it is preferred to add a quite large metal post in the TE10 waveguide centreline, in a position between the slots. This is a further embodiment of the invention.

When using the TEy51 or higher-order main power-transferring modes, the complementary mode can be TEy11 as above, but also (in combination or alone) the TEy31 mode. For still higher-order modes as the main power-transferring mode, more choices are available for the complementary mode. Generally speaking, the main power-transferring mode should be a $TEym_1n$ mode and the complementary mode should be a $TEym_2n$ mode, wherein ml, $m_2$ and n are positive odd integers and $m_2$ and n are both less or equal to $m_1-2$. However, when using higher-order modes it becomes increasingly difficult to eliminate unwanted modes. Mode filters in the form of two or several y-directed metal rods or plates extending all the way between opposite applicator walls are then preferred. The positions of these rods can be determined by experiment or by electromagnetic modelling. The target or goal function is then to obtain a heating pattern characterised dominantly by the m−1 y-directed elongated hot zones under the applicator being equal in strength, plus another, weaker, elongated hot zone just below each y-directed applicator side wall. This is a still further embodiment of the invention.

The major characteristic of unwanted LSM modes is that an x-directed energy propagation is created and maintained also further sideways away (i.e. in the x direction) from the applicator opening projection on the metal plane. The LSM mode or modes under the load are dependent on x-directed currents in the metal plane below the belt and load. Their unwanted propagation beyond the applicator projection can therefore be reduced if the x-directed current path in the metal plate is disturbed or interrupted. The preferred method for this is to use a corrugated plate (with the corrugations in the y direction, i.e. in the direction of belt movement), or to mount or weld metal profiles which create a similar pattern. It can be said that the height steps cause changes in the x-directed impedance of the LSM mode, so that it is reflected mainly between adjacent height steps. Again, the optimisation of the metal plate corrugation pattern is by experiment and/or electromagnetic modelling. The goal function is to maintain a good heating from below (i.e. an LSM mode), but minimising spread-out in the x direction from all sideways-mounted applicators. The use and optimisation of these corrugations or similar is another further embodiment of the invention.

The field characteristics of all TEym1 modes at the vertical y-directed sidewalls are quite similar. One characteristic is that there are dominating horizontally directed magnetic fields near the tunnel sidewalls outside the heating section of the microwave tunnel. An efficient way of choking these fields and by that accomplishing a microwave leakage reduction in the tunnel openings is to provide a horizontal elongated quarterwave slot in the above-mentioned part of the tunnel side. Since this slot can be located a quite small vertical distance away from the applicator opening, it will function also with variable tunnel height equipment. This is also another embodiment of the invention.

DETAILED DESCRIPTION

Figure 1:
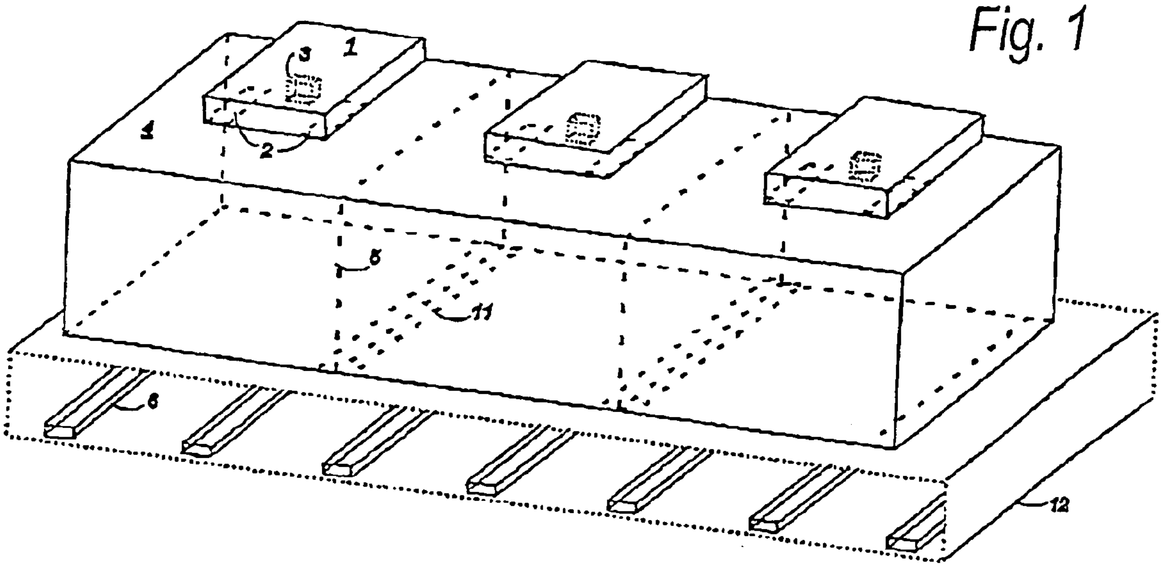
FIG. 1 shows a perspective view of an applicator according to the present invention.
Figure 2:
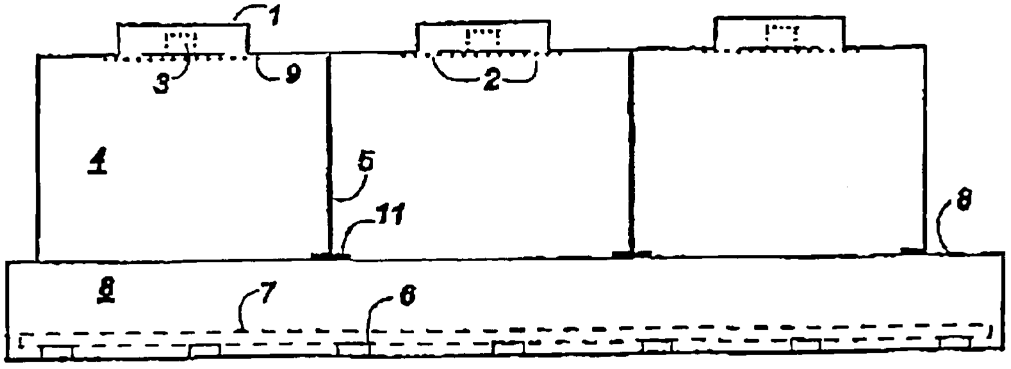
FIG. 2 shows a front view of the applicator shown in FIG. 1 according to the present invention.

Throughout all the figures the following reference signs refer the different parts as:

1 waveguide
2 applicator feed slots (ceiling slots)
3 large metal post
4 applicator (space)
5 inter-applicator wall
6 y-directed metal bars, galvanically contacting the bottom of the tunnel r section
7 conveyor belt
8 tunnel (space)
9 applicator feed slot cover (microwave transparent)
10 mode choke in tunnel top/bottom
11 horizontal metal plates
12 tunnel side (asymmetrical)
13 horizontal metal bars for applicator mode filtering FIG. 1 and FIG. 2 show a perspective and right view, respectively, of an applicator 4 with a conveyor belt 7. The loads are not shown. There is a low TE10 feeding waveguide 1 on top of the applicator, with two slots 2 into the applicator. There is a large metal post 3 in the region between the slots; this can be fixed to either the top or bottom plane of the waveguide. There is a vertical wall 5 between adjacent applicators, with horizontal metal plates 11 at the lower ends. At the bottom of the tunnel section 8 there are y-directed metal bars 6, galvanically contacting the bottom of the tunnel section.

Figure 3:
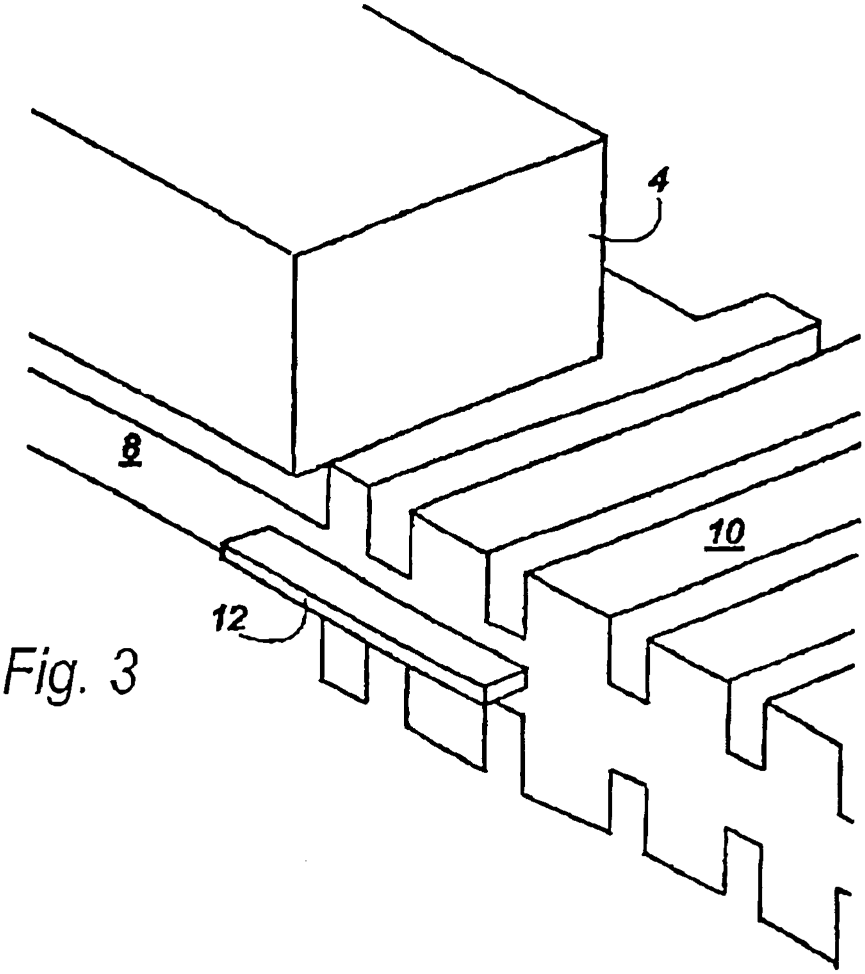
FIG. 3 shows an embodiment of system according to the present invention.
Figure 4:
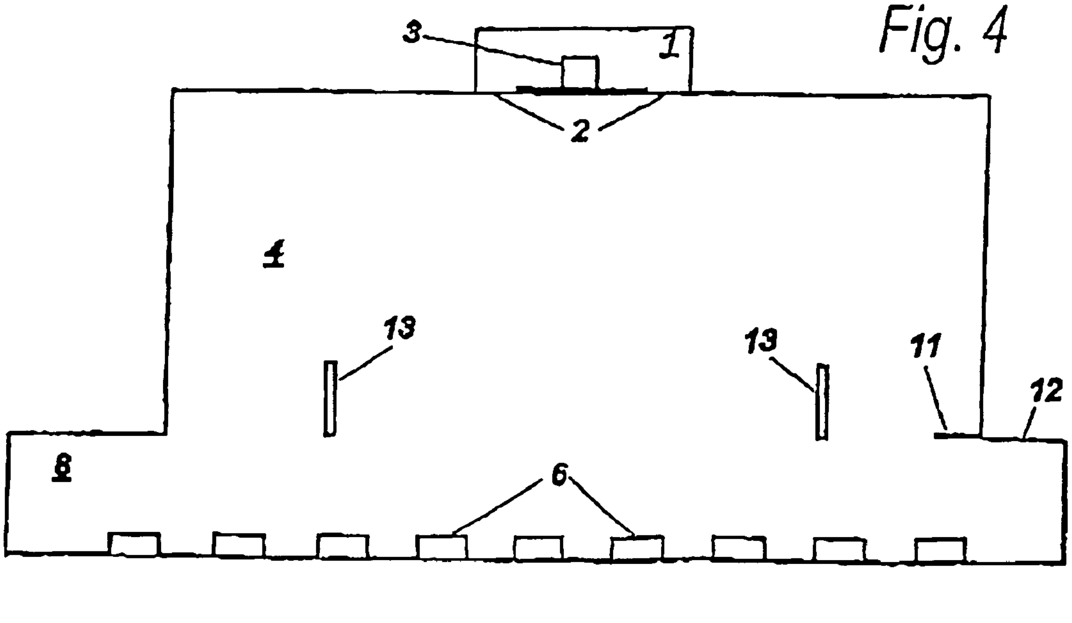
FIG. 4 shows another embodiment of the applicator according to the present invention.

In FIG. 3, some of the same components are shown, plus the horizontal side choke 9 in the tunnel end section 10, which has a number of ridges creating a choking structure of a kind, which is not a subject of the present invention. FIG. 4 shows a TEy51 mode applicator with a larger x dimension. It also has metal plates 13 extending all the way in the y direction between opposite applicator walls.

The first item of the present invention is the applicator itself, consisting of an open-ended rectangular box with such dimensions that it can firstly enhance a TEy31 mode with a long vertical wavelength, and secondly create a significant, semi-resonant amplitude of the TEy11 mode. As an example, inner dimensions 194×308 mm in the xy directions and height 140 mm fulfils these criteria, at the ISM frequency of 2450 MHz. In a first step that can be calculated directly by known analytical methods for waveguides; one finds vertical wavelengths of about 480 and 132 mm, respectively. The long TEy31 mode wavelength provides the favourable conditions according to PAT, which also means that the mode is of the Brewster type so that the reflection by the load is low; the non-resonant mode transfers significant power to the load. The horizontal plates 11 do not close the applicator downwards, but the relative spatial phase of the two modes in the region at and just below the horizontal plane of the applicator end becomes opposite such that the magnetic (H) fields largely cancel if the relative amplitudes of the two modes are approximately equal in that region. The result of this is that the field pattern of the TEy31 mode will not be disturbed much by the cessation of a vertical applicator wall, so that it will continue to propagate straight downwards. The optimisation of this function and the mode balance can nowadays be performed by electromagnetic modelling rather than by tedious experiment, once the desired field structure conditions are known.

A quite similar optimisation can be made with the TEy51 mode as major carrier of power. This is shown in FIG. 4, and the applicator dimensions are now 325×305×140 mm. Since a larger number of modes can be excited in a larger cavity or applicator, there is now a need to stabilise the desired mode so that it is neither distorted or becomes degenerate with some unwanted mode. This stabilisation is achieved by the metal plates shown in the figure. The optimisation can of course be made by experiment, but a nowadays much faster method is to use electromagnetic modelling. Again, the prior knowledge of what the optimisation means in terms of field patterns is helpful in making the work quite quick and efficient.

Yet another example is a case where the TEy71 mode is used as the main power-transferring mode, and the TEy31 mode is used as the complementary mode. In this case, suitable applicator dimensions are found to be 436×306 mm in the xy directions and a height of 140 mm. In order to eliminate unwanted modes, it is again preferred to introduce a pair of vertical plates at the open end of the applicator. These vertical plates should have a length that runs between the inner walls of the applicator (i.e. a length of 306 mm in this example). The height of the plates is preferably about 30 mm. The plates should be positioned 136 mm from the inner walls in the long direction, i.e. 164 mm apart.

The second item of the present invention relates to the microwave feed of the applicator. The applicator dimensions of the examples given here indicate that the x-directed wavelength is quite short: 2×(193/3) mm=129 mm; 2×(325/5)=130 mm (the free space wavelength is 122 mm). According to known mode theory, the vertical mode impedances thus become very low. This problem is also addressed in PAT, where it is claimed that only a vertical feed plane near the topside of an applicator wall provides good impedance matching conditions.

By using a combination of parallel slots 2 in the feeding TE10 waveguide 1, a first impedance reduction is obtained. Further impedance reduction is obtained by using a quite low waveguide (i.e. a small b dimension); 20 or 25 mm are typical such dimensions according to the present invention. Hence, in a typical embodiment of the invention, the wide (a) dimension (the width) of the TE10 waveguide is chosen to be as in the standard WG340, i.e. about 86 mm, and the narrow (b) dimension (the height) is chosen according to above to be about 20–25 mm. In addition, it might be necessary in view of impedance reduction and matching to introduce a quite large metal post 3 in the waveguide centreline, between the slots 2. Typical dimension of such rectangular post are 12×20 mm in the base, and a height of about 9–11 mm.

There will then be a need for increasing the waveguide impedance, and also creating a proper waveguide transition for the microwave generator, which is a magnetron in the typical case. This is made by known techniques to increase the b dimension of the waveguide, possibly in combination with a so-called E knee which then provides a vertical waveguide section which can have the desired length and also protect the magnetron against heating and contamination by the applicator under operation.

The third item of the present invention relates to the need of reducing the action and spread-out of LSM modes created by the major applicator TEym1 mode. As said earlier, this is achieved by making corrugations or introducing metal rods at the tunnel bottom. Typically at 2450 MHz, an electrical height of between 10 and 20 mm between the metal bottom and the underside of the load items provides desirable conditions for under-heating by LSM modes. A corrugation height of 7 to 10 mm will then reduce the unwanted x-directed spread-out beyond the projection of each applicator. The metal plates or corrugations should typically not be more than what is just needed for this action, since the desired under-heating may otherwise become too weakened. As for the earlier embodiments, electromagnetic modelling can nowadays perform the optimisation of this function rather than by tedious experiment, once the desired field structure conditions are known.

The fourth item of the present invention relates to the need to reduce microwave leakage between, primarily at the tunnel ends, under conditions of the quite large tunnel heights, which are possible to achieve by employing the first item of this invention. By using a known type of so-called mode choke at the horizontal upper and lower planes of the tunnel ends (see FIG. 3), a quite efficient reduction can be obtained with a short such section for more than 130 mm total tunnel heights. Since the vertical tunnel wall currents at the applicators with the particular modes used here have a strong vertical component away from the applicator, using a choke of a kind, which in itself is known. The special technical feature of this fourth item lies in the length and location of the choke; the length is typically 250 mm or more (which is possible since the length of the mode choke is larger); the-y-directed location of the choke is such that it begins just after the last vertical x-directed wall of the last applicator, and the z directed location is 20 . . . 30 mm below the opening plane of the applicators.

The present invention is not limited to the above-described preferred embodiments. Various alternatives, modifications and equivalents may be used. Therefore, the above embodiments should not be taken as limiting the scope of the invention, which is defined by the appending claims.

The invention claimed is:

1. A rectangular microwave heating applicator arranged to operate at a predetermined frequency, and comprising a microwave enclosure forming a cavity having first and second transverse dimensions and a longitudinal dimension in a direction of propagation of microwave energy, wherein the dimensions are such that, at the predetermined frequency, a main power-transferring TEy$m_1$n mode with a long vertical wavelength is enhanced, and a significant amplitude of a complementary TEy$m_2$ n mode is created, wherein $m_1$, $m_2$, and n are positive odd integers and $m_2$ and n are both less than or equal to $m_1-2$, the applicator further comprising two parallel feed slots in a top wall of the applicator connecting the microwave enclosure to a TE10 waveguide, and a metal post arranged at a centerline of the waveguide between the feed slots.

2. The applicator of claim 1, further comprising corrugations or metal rods at a tunnel bottom of the applicator in order to reduce action and spread-out of longitudinal section magnetic (LSM) modes created by the TEy$m_1$n mode.

3. The applicator of claim 1, wherein a mode choke is achieved at horizontal upper and lower planes of tunnel ends of the applicator using a horizontal elongated quarterwave slot provided in vertical y-directed sidewalls of tunnel sides of the applicator, and wherein the mode choke is adapted to reduce microwave leakage in tunnel openings of the applicator.

4. The applicator of claim 1, wherein the main power-transferring mode is a TEy31 mode, and wherein the complementary mode is a TEy11 mode.

5. The applicator of claim 1, wherein the main power-transferring mode is a TEy71 mode, and wherein the complementary mode is a TEy31 mode.

6. The applicator of claim 1, wherein a width of the waveguide is about 86 mm, and wherein a height of the waveguide is about 20–25 mm.

7. The applicator of claim 1, wherein horizontal dimensions of the metal post are 12 mm×20 mm, and wherein a height of the post is about 9–11 mm.

8. The applicator of claim 4, wherein the first and second transverse dimensions of the cavity are 194 mm×308 mm, and the longitudinal dimension is 140 mm, in order for the applicator to enhance the main power-transferring TEy31 mode and the complementary TEy11 mode at an operating frequency of 2450 MHz.

9. The applicator of claim 5, wherein the first and second transverse dimensions of the cavity are 306 mm×436 mm, and the longitudinal dimension is 140 mm, in order for the applicator to enhance the main power-transferring TEy71 mode and the complementary TEy31 mode at an operating frequency of 2450 MHz.

* * * * *